United States Patent
Hurkx et al.

[11] Patent Number: 5,694,071
[45] Date of Patent: Dec. 2, 1997

[54] ELECTRONIC DEVICE COMPRISING MEANS FOR COMPENSATING AN UNDESIRED CAPACITANCE

[75] Inventors: Godefridus A. M. Hurkx; Petrus G. M. Baltus; Marinus P. G. Knuvers; Cornelis M. Hart, all of Eindhoven, Netherlands

[73] Assignee: U.S. Philips Corporation, New York, N.Y.

[21] Appl. No.: 615,558

[22] Filed: Mar. 12, 1996

[30] Foreign Application Priority Data

Mar. 13, 1995 [EP] European Pat. Off. .............. 95200600

[51] Int. Cl.$^6$ ........................................ H03K 5/08
[52] U.S. Cl. ...................... 327/314; 327/320; 327/583; 327/586
[58] Field of Search ............................. 327/314, 320, 327/325, 493, 583, 584, 586

[56] References Cited

PUBLICATIONS

IEEE Transactions on Electron Devices, vol. ED–13, No. 1, p. 169–174.

*Primary Examiner*—Timothy P. Callahan
*Assistant Examiner*—Jeffrey Zweizig
*Attorney, Agent, or Firm*—Leroy Eason

[57] ABSTRACT

A device compensated for an undesired capacitance includes a first and a second node between which nodes the undesired capacitance is present. A diode driven in breakthrough is coupled between the first and the second node. As a diode driven in breakthrough exhibits the characteristics of a negative capacitance, a compensation of the undesired capacitance is achieved.

13 Claims, 3 Drawing Sheets

5,694,071

ELECTRONIC DEVICE COMPRISING MEANS FOR COMPENSATING AN UNDESIRED CAPACITANCE

BACKGROUND OF THE INVENTION

The invention relates to an electronic device comprising two nodes and means for compensating at least a part of a capacitive impedance between said nodes.

In the field of electronic devices undesired or parasitic capacitances between two nodes often restrict the usefulness of such an electronic device, as these undesired capacitances limit the upper frequency at which the device can be used, or even cause instability of the device. In the general prior art a coil is often used as means for compensating said undesired capacitances, by placing the coil between said nodes and thus in parallel with said undesired capacitance. A drawback of such a coil is that it requires a very large surface area on an integrated circuit when integrated, and is therefore expensive. An external coil requires extra pins connected to the integrated circuit. Furthermore, the coil may need adjustment for an exact compensation.

SUMMARY OF THE INVENTION

It is an object of the present invention to provide a device with means for at least partially compensating an undesired capacitance, said means being compact and easily integratable.

A device according to the invention is characterised in that said means comprise a reverse-biased diode coupled to said nodes, said diode being driven in breakthrough.

The invention is based on the recognition that the impedance of a reverse-biased diode exhibits the behaviour of a negative value capacitance, connected in parallel with a resistance, and can be used advantageously for compensating an undesired positive capacitance. By placing the negative capacitance in parallel with the undesired positive capacitance, this positive capacitance can be cancelled at least partially. By using the measure according to the invention both a compact and easily integratable means for compensating an undesired capacitance is realised.

An embodiment of the device according to the invention is characterised in that said device comprises a transistor in common-collector configuration, the diode being coupled between an emitter of the transistor and a reference terminal.

A common-collector transistor circuit loaded at the emitter output with a significant—often undesired—capacitance can become instable. By compensating the undesired capacitance with a diode driven in breakthrough, coupled to said emitter output, the stability of the common-collector transistor circuit is significantly improved.

A further embodiment of such a device according to the invention is characterised in that said device comprises a transistor in common-emitter configuration, the diode being coupled between a collector of the transistor and a reference terminal. The bandwidth of a common-emitter transistor circuit is often limited by parasitic or undesired capacitances seen at the collector output of said circuit. By providing a diode driven in breakthrough, coupled to the collector output, the bandwidth is improved significantly. A further advantage is that due to the remaining differential resistance of the diode, a collector resistor is no longer required, as the differential resistance of the diode can be used as collector resistor, when the diode is properly dimensioned.

An embodiment of a device according to the invention is characterised in that the device is an integrated circuit on semiconductor material. The measure of the invention is especially suited for integration on semiconductor material as no external components are required. Furthermore, especially in the field of semiconductor devices the problem of undesired or parasitic capacitances often limits the performance of such devices.

Another embodiment of such a device according to the invention is characterised in that one of the nodes is connected to a bondpad. In integrated circuits, inputs and outputs of the circuit are provided via bondpads. A bondpad has a significant capacitance to the substrate of the semiconductor material, and thus often limits the bandwidth of said inputs or outputs of the integrated circuit. This parasitic capacitance can be cancelled by coupling a diode driven in breakthrough to the bondpad.

An embodiment of such a device according to the invention is characterised in that one of the nodes is connected to an interconnect wire of the integrated circuit. Interconnect wires on an integrated circuit are used to connect different components in the circuit. As these wires are close to the semiconductor material, they have a parasitic capacitance, which can be compensated using the measure according to the invention.

A further embodiment of such a device according to the invention is characterised in that a buried layer is placed between the bondpad or interconnect wire and a substrate of the semiconductor material and that the diode is connected between the bondpad or interconnect wire and the buried layer.

By incorporating a buried layer in the semiconductor material below the bondpad or interconnect wire, the parasitic capacitance will now be formed between the bondpad or interconnect wire and said buried layer, instead of between the bondpad or interconnect wire and the substrate. Now the value of the parasitic capacitance will be well-defined as during the fabrication of the semiconductor material the distance between said layer and the bondpad or interconnect wire can be controlled accurately. Now an accurate compensation of said parasitic capacitance is possible by a proper dimensioning of the diode in breakthrough. A further advantage is that the parasitic capacitance is contained between said bondpad or wire and said layer, thus reducing a coupling with other devices present on the semiconductor material.

An embodiment according to the invention is characterised in that said device further comprises means for providing a bias current through the diode. By selecting a bias current through the diode, it is possible to select an appropriate value of the negative capacitance of the diode, which allows an accurate compensation of the undesired capacitances in situations where the value of the negative capacitance needs to be tuned to a value of an undesired capacitance.

BRIEF DESCRIPTION OF THE DRAWINGS

The above object and features of the present invention will be more apparent from the following description of the preferred embodiments with reference to the drawings, wherein.

In the figures, identical parts are provided with the same reference numbers.

DESCRIPTION OF THE RELATED ART

Figure 1:
FIG. 1 is a circuit diagram of the equivalent circuit of a diode in breakthrough at frequencies below the avalanche frequency.

In IEEE Transactions on Electron Devices, Vol. ED-13, No. 1, p.169–174, the behaviour of avalanche diodes is described. This article concentrates on the effect that at frequencies higher than the avalanche frequency, the resistive part of the impedance of the diode is negative. This effect can be used advantageously in for example oscillators. For frequencies lower than the avalanche frequency, the diode can be regarded as a series arrangement of a resistor and a coil. This is also known from the above-mentioned article. FIG. 1 shows a circuit diagram of the equivalent circuit of a diode in breakthrough at frequencies below the avalanche frequency, which circuit comprises a series arrangement of a resistor having a resistance R and a coil having an inductance L. The admittance $Y_s$ of the series arrangement of FIG. 1 is given by:

$$Y_s = \frac{1}{R+j\omega L} = \frac{1-j\omega \frac{L}{R}}{R\left(1+\frac{\omega^2 L^2}{R^2}\right)}$$

where $\omega$ is the radial frequency.

Figure 2:
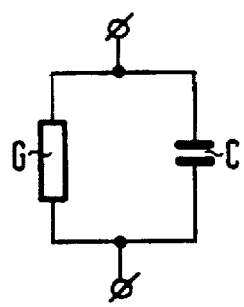
FIG. 2 is a circuit diagram of an approximation of the equivalent circuit of a diode in breakthrough at frequencies below the avalanche frequency.

If the resistance value of the resistor is significantly larger than the impedance of the coil, this series arrangement can be approximated by a parallel arrangement of said resistor with a capacitor, which has a negative capacitance. This approximation is valid for frequencies lower than the avalanche frequency. FIG. 2 shows the approximation of the equivalent circuit by a parallel arrangement of a conductor having a conductance G, where G=1/R, and a capacitor having a capacitance C. The admittance $Y_p$ of the parallel arrangement of FIG. 2 is given by:

$$Y_p = G+j\omega C$$

As these admittances $Y_s$ and $Y_p$ should be equal, it follows from the expressions for $Y_s$ and $Y_p$ that the capacitance value C is negative and frequency dependent and given by:

$$C(\omega) = -\frac{L}{R^2+\omega^2 L^2}$$

Thus the diode operating in breakthrough at frequencies below the avalanche frequency can be regarded as a parallel arrangement of a conductor G and a negative capacitance C. By switching a negative capacitance parallel to a positive capacitance, the positive capacitance is compensated. Thus by switching a diode operating in breakthrough in parallel with an impedance, comprising a capacitive component, this capacitive component can effectively be compensated. As a diode is a rather simple and small device as well as easily integratable, the present invention offers an attractive solution for compensation of undesired capacitances, especially in integrated circuits. The breakthrough mentioned here is a generation of carriers caused by band-band tunnelling or impact-ionisation or both. Thus the breakthrough mechanism is not restricted to avalanche breakthrough, but comprises other breakthrough mechanisms, such as tunnelling, as well.

Figure 3:
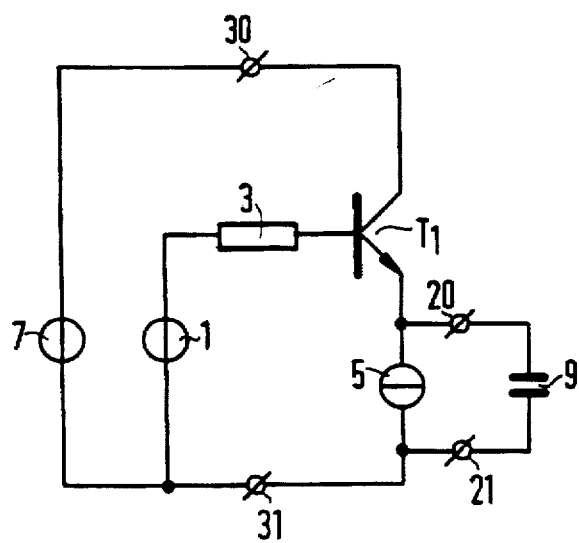
FIG. 3 is a circuit diagram of a first known amplifier arrangement.

FIG. 3 shows a circuit diagram of a first known amplifier arrangement a so-called common-collector arrangement. A voltage source 1 is coupled to the base of transistor T1 via resistor 3. The emitter of transistor T1 is connected to a first node 20. A current source 5 is coupled between first and second nodes 20 and 21, respectively, of which nodes at least one is carrying a signal. The second node 21 is connected to reference terminal 31. A supply voltage source 7 is coupled to reference terminals 30 and 31. The collector of transistor T1 is coupled to reference terminal 30. This amplifier arrangement is often used as a buffer between a high impedance output, here represented by voltage source 1 and resistor 3, and a low impedance load. This load often comprises a substantial capacitive part, here represented by capacitor 9 coupled between nodes 20 and 21. This capacitive load can be caused by a number of things. For instance, the output of the amplifier arrangement is usually coupled to inputs of other transistor circuits. The inputs of these transistor circuits often have parasitic capacitances, especially in integrated circuits, thus loading the output of the amplifier arrangement capacitively. Furthermore, the wires connecting the output of the amplifier arrangement to other circuit often have parasitic capacitances in integrated circuits. The combination of a high impedance output together with a capacitive load often leads to instability of the amplifier arrangement at high frequencies.

DESCRIPTION OF THE PREFERRED EMBODIMENTS

Figure 4:
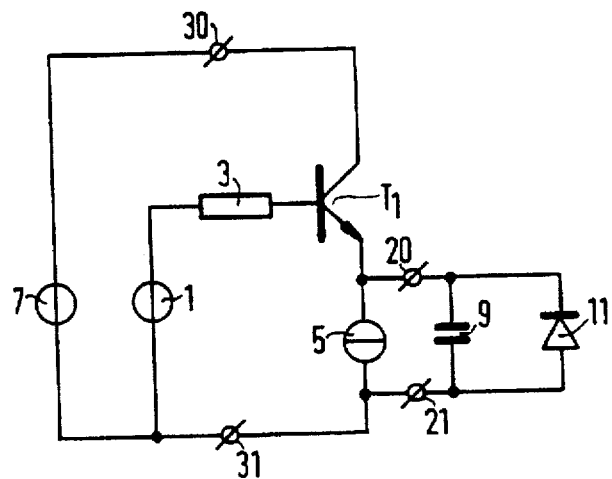
FIG. 4 is a circuit diagram of a first embodiment of an electronic device according to the invention.

FIG. 4 shows a circuit diagram of a first embodiment of an electronic device according to the invention. FIG. 4 differs from FIG. 3 in that a diode 11 in breakthrough is added to the amplifier arrangement, an anode of said diode being coupled to node 20 and a cathode of said diode being coupled to node 21. By using a diode in breakthrough parallel to the capacitive load, the capacitive part of the load can be compensated fully in a particular frequency band (or partially, if so desired), thereby avoiding the above-mentioned instability. The value of the negative capacitance can be adjusted by placing an additional current source in series with the diode, as the value of the negative capacitance is a function of the current through the diode. From the above it follows that the use of such a diode in breakthrough is not restricted to compensating the parasitic capacitances as seen at the output of an amplifier, but also comprises the compensation of parasitic capacitances at an input of an amplifier.

Figure 5:
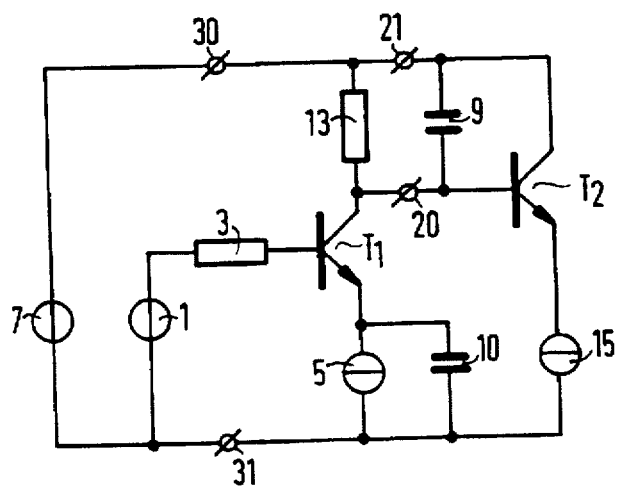
FIG. 5 is a circuit diagram of a second known amplifier arrangement.

FIG. 5 shows a circuit diagram of a second known amplifier arrangement. FIG. 5 differs from FIG. 3 in the following:

- a resistor 13 is coupled between the collector of transistor T1 and the reference terminal 30,
- transistor T2 and current source 15 are added, the base of transistor T2 being coupled to the collector of transistor T1, the collector of transistor T2 being coupled to reference terminal 30 and the current source 15 being coupled on one side to the emitter of transistor T2 and on another side to reference terminal 31, node 20 is now the node to which the collector of transistor T1 and the base of transistor T2 are coupled, node 21 is connected to reference terminal 30, the capacitor 9, representing parasitic capacitances, is coupled between nodes 20 and 21, a capacitor 10 is provided, so that the emitter of transistor T1 is virtually short-circuited to reference terminal 31 for AC signals.

This type of amplifier arrangement is commonly used in high frequency integrated circuits. The dominant restriction of the bandwidth of this amplifier arrangement is mainly determined by the time constant, consisting of the product of the resistance value of resistor 13 and the total capacitance value of parasitic capacitances of transistor T1 (collector-substrate and collector-base capacitances), wires and transistor T2 (collector-base, base-emitter and diffusion capacitances), said resulting capacitance value being seen between nodes 20 and 21 as a capacitance of capacitor 9.

Figure 6:
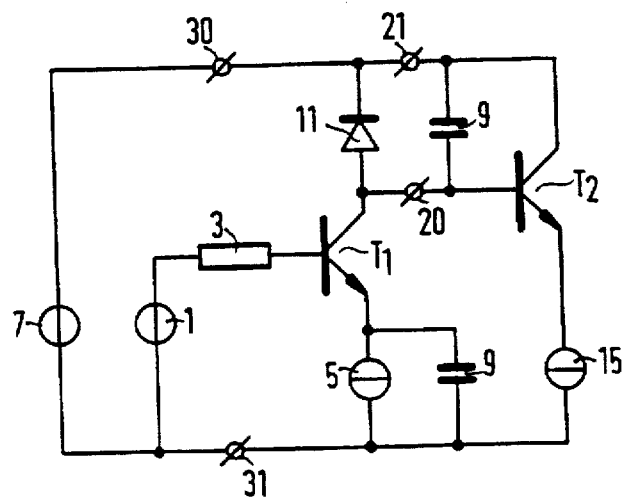
FIG. 6 is a circuit diagram of a second embodiment of an electronic device according to the invention.

FIG. 6 is a circuit diagram of a second embodiment of an electronic device according to the invention. FIG. 6 differs from FIG. 5 in that resistor 13 is replaced by diode 11, an anode of the diode 11 being coupled to node 21 and a cathode of said diode being coupled to node 20. By replacing resistor 13 with a diode operating in breakthrough, the capacitance value of capacitance 9 can be (at least partially) compensated, thereby increasing the bandwidth of the amplifier arrangement. The differential resistance of the diode 11 operating in breakthrough can be used as a replacement of resistor 13, although it is also possible to put the diode 11 in parallel with the resistor 13. Transistor T2 is not essential to the amplifier arrangement of FIGS. 5 and 6, but only serves as an illustration of a possible source of parasitic capacitances, limiting the bandwidth of the amplifier arrangement. It furthermore possible to compensate the collector-base capacitance of transistor T1 in FIG. 5, by coupling a diode driven in breakthrough over the collector-base junction of the transistor T1, by coupling the anode of the diode to the base of the transistor and coupling the cathode of the diode to the collector of the transistor. A variant of the amplifier arrangement of FIG. 5, in which a feedback resistor is coupled between the collector and the base of the transistor, can also be equipped with a diode driven in breakthrough for compensation of the collector-base capacitance of the transistor. For such a compensation the anode of the diode is coupled to the base of the transistor and the cathode of the diode is coupled to the collector of the transistor.

Figure 7:
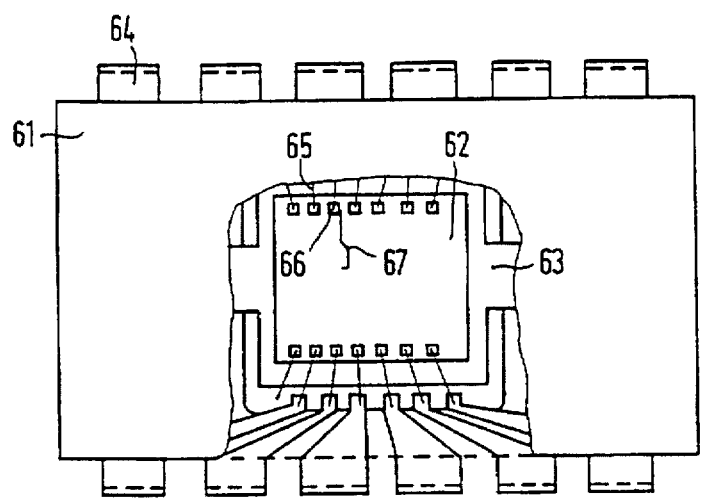
FIG. 7 is a diagram of an integrated semiconductor device.

FIG. 7 is a diagram of an integrated semiconductor device. A semiconductor body 62 in a casing or housing 61 is mounted on a support 63 and bondpads 66 of the integrated device are connected to the connection pins 64 via bonded wires 65. A bondpad in an integrated semiconductor device has a parasitic capacitance to a substrate of the semiconductor device. This parasitic capacitance between the bondpad and the substrate can be compensated by a diode in breakthrough, coupled between the bondpad and the substrate. The integrated semiconductor device comprises at least one interconnect wire 67 which in this specific example is coupled to the bondpad 66. As is well-known, interconnect wires are also used for providing a connection between devices, said devices being integrated on the semiconductor body 62. Interconnect wires in integrated circuits have parasitic capacitances between the wire and—for example—the substrate of the semiconductor body 62, which can be compensated by a diode in breakthrough, coupled between the wire and the substrate. Although in practice it may be so that the diode is coupled to an interconnect wire anyway, this example is merely intended to illustrate that the diode in breakthrough can also be used for compensation of the parasitic capacitance of such an interconnect wire.

Figure 8:
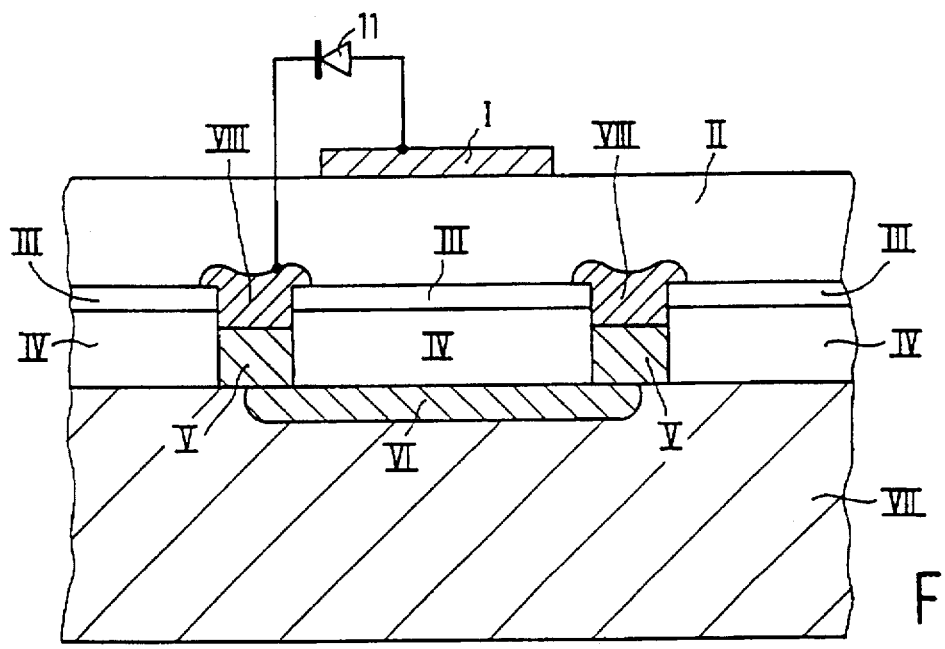
FIG. 8 is a cross section of a semiconductor device, comprising a bondpad and, schematically, a diode used in accordance with the teachings of the invention.

FIG. 8 shows a cross section of a semiconductor device, comprising a bondpad and, schematically, a diode used in accordance with the teachings of the invention. The structure of the semiconductor device shown is only intended as an illustration and should not be considered in a restrictive sense.

The semiconductor material is fabricated in process steps, which are commonly known. Area I is a metallic bondpad, similar to the bondpads 66 of FIG. 7. Instead of a bondpad, the area I may also represent an interconnect wire. Area II is an insulating layer of $SiO_2$. Area III is a thin layer of $SiO_2$, with metallic contacts VIII making a connection with areas V and VI, which areas are heavily doped n-type material. Area VI is a so-called buried n-layer and is connected to a reference potential. Area IV is a further $SiO_2$ layer. Area VII is the p-type substrate of the semiconductor material and is usually connected to a ground reference. Without the buried n-layer, there would be a parasitic capacitance between the bondpad (area I) and the substrate (area VII). In densely packed semiconductor devices having a large number of devices closely spaced on the semiconductor body, possible parasitic capacitances may occur between the bondpad and devices, which are close to the bondpad. This results in a number of parasitic capacitances emanating from the bondpad. The amount and values of the capacitances are not well defined and therefore difficult to compensate. By adding the buried n-layer VI, a parasitic capacitance will be defined between the bondpad and said buried n-layer VI. As the distance between the layer and the bondpad is well-controlled by the thickness of the layers between them, a well-defined parasitic capacitance is obtained, which is restricted to the area between the bondpad and the buried n-layer. Thus there will be no longer any significant parasitic capacitances between the bondpad and neighbouring devices. A well-defined parasitic capacitance can be more easily be compensated than a less clearly defined parasitic capacitance from bondpad to substrate or even to neighbouring devices. For a compensation of said parasitic capacitance a diode 11 in breakthrough can be connected between the bondpad and the buried n-layer. For this purpose the bondpad can be biased at a relatively low bias voltage and the buried n-layer can be biased at a sufficiently high bias voltage for driving the thus reverse-biased diode 11 in breakthrough.

Figure 9:
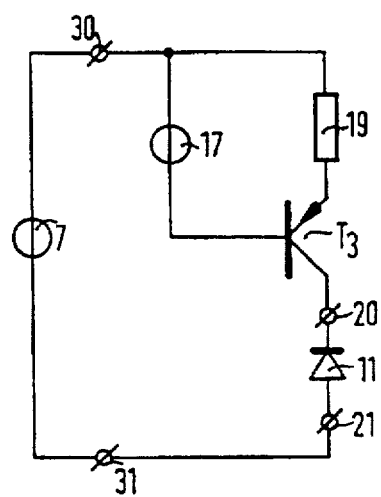
FIG. 9 is a circuit diagram of a biasing circuit for a diode, used in accordance with the teachings of the invention.

By selecting an appropriate bias voltage component of the voltage supplied by voltage source 1 in FIG. 4, the diode 11 will be driven in breakthrough. By selecting an appropriate value for the voltage by voltage source 7 the diode 11 in FIG. 6 will also be driven in breakthrough automatically. In the case of a diode being coupled between for example a bondpad and a substrate, a separate bias circuit may be required to drive the diode in breakthrough. In FIG. 9 a circuit diagram is shown of a biasing circuit for a diode, used in accordance with the teachings of the invention. This exemplary circuit can be used if there is no breakthrough possible by an appropriate selection of supply or bias voltages, as in FIGS. 4 and 6. The circuit shown is in principle a simple transistor circuit, where the base of transistor T3 receives a bias voltage supplied by voltage source 17. The emitter of transistor T3 is coupled via resistor 19 to reference terminal 30. The diode is coupled between node 21, which is connected to reference terminal 31, and node 20, which is connected to the collector of transistor T3.

Voltage source 7 is coupled between reference terminals 30 and 31. If the voltage across the diode 11 is sufficiently large, the diode 11 will be driven in breakthrough. By a proper selection of the voltage supplied by voltage source 17 and the resistance value of resistor 19, the current through the diode can be set at a desired value. This biasing circuit can be used for instance for biasing the diode when it is coupled to a bondpad, represented by node 20, and where the substrate can be represented by node 21.

A diode operated in breakthrough can also be used advantageously to reduce the minimum capacitance value of a variable capacitance diode by switching a diode in breakthrough parallel to the variable capacitance diode, thereby increasing the relative range of the variable capacitance. Other applications, such as the compensation of the input capacitance of a Surface Acoustic Wave (SAW) filter using a diode in breakthrough, or using a diode in breakthrough in an impedance matching network may come to mind.

The use of the diode in breakthrough as compensation means has as further advantage over conventional compensation means—such as a coil—, that for DC there is no short circuit, due to the remaining differential resistance of the diode. This means that no DC blocking capacitor is required, such a DC blocking capacitor being as a rule undesirable in integrated circuits, as they either require a significant chip area for a sufficiently large capacitance value or are implemented as an external capacitor, requiring extra pins, connected to the integrated circuit, for the external connection of said DC blocking capacitor. This property is exploited in FIG. 6, where the diode compensates capacitance 9 as well as replaces resistor 13 of FIG. 5.

The embodiments of the present invention described herein are intended to be taken in an illustrative and not a limiting sense. In the circuits shown previously, the NPN (or PNP) transistors can of course be substituted by PNP (or NPN) transistors, in which case the direction of the diode 11 should be reversed. The diode can be implemented as a transistor of which only the base-emitter or base-collector is used. Various other modifications may be made to these embodiments by persons skilled in the art without departing from the scope of the present invention as defined in the appended claims.

We claim:

1. An electronic device comprising: two nodes and means for compensating at least a part of a capacitive impedance between said nodes, wherein said means comprise a reverse-biased diode coupled to said nodes and with said diode being driven in breakthrough.

2. The device of claim 1, which further comprises a transistor in common-collector configuration with the diode coupled between an emitter of the transistor and a reference terminal.

3. The device of claim 1 which further comprises a transistor in common-emitter configuration, with the diode coupled between a collector of the transistor and a reference terminal.

4. The device of claim 1, wherein the device is an integrated circuit on semiconductor material.

5. The device of claim 4, wherein one of the nodes is connected to a bondpad.

6. The device of claim 5 wherein one of the nodes is connected to an interconnect wire of the integrated circuit, a capacitance of said wire to the substrate being the part of the capacitive impedance to be compensated.

7. The device of claim 6, which comprises a buried layer between the bondpad or interconnect wire and a substrate of the semiconductor material, and wherein the diode is connected between the bondpad or interconnect wire and the buried layer.

8. The device of claim 1, which further comprises means for providing a bias current through the diode.

9. The device of claim 2, which further comprises a transistor in common-emitter configuration with the diode coupled between a collector of the transistor and a reference terminal.

10. The device of claim 4, wherein one of the nodes is connected to an interconnect wire of the integrated circuit, a capacitance of said wire to the substrate being the part of the capacitive impedance to be compensated.

11. The device of claim 10, which comprises a buried layer between the interconnect wire and a substrate of the semiconductor material, and wherein the diode is connected between the interconnect wire and the buried layer.

12. The device of claim 2, which further comprises means for providing a bias current through the diode.

13. The device of claim 3, which further comprises means for providing a bias current through the diode.

* * * * *